(12) United States Patent
Poletto et al.

(10) Patent No.: US 10,848,062 B2
(45) Date of Patent: Nov. 24, 2020

(54) METHOD OF OPERATING A CONTROLLER, CORRESPONDING CIRCUIT AND DEVICE

(71) Applicant: STMicroelectronics S.r.l., Agrate Brianza (IT)

(72) Inventors: Vanni Poletto, Milan (IT); Diego Alagna, Milan (IT); Nicola Errico, Rho (IT); Marco Cignoli, Pavia (IT); Gian Battista De Agostini, Bariano (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/660,215

(22) Filed: Oct. 22, 2019

(65) Prior Publication Data

US 2020/0136511 A1 Apr. 30, 2020

(30) Foreign Application Priority Data

Oct. 31, 2018 (IT) .................. 102018000009991

(51) Int. Cl.
*H02M 3/158* (2006.01)
*H02M 3/157* (2006.01)
*H02M 3/155* (2006.01)

(52) U.S. Cl.
CPC ........... *H02M 3/158* (2013.01); *H02M 3/157* (2013.01); *H02M 2003/1555* (2013.01)

(58) Field of Classification Search
CPC ...... H02M 3/155; H02M 3/156; H02M 3/158; H02M 3/157; H02M 2003/1555; G05F 1/10; G05F 1/40; G05F 1/44; G05F 3/01; G05F 3/08; G05F 5/00
See application file for complete search history.

(56) References Cited

U.S. PATENT DOCUMENTS

| 7,440,821 B1 | 10/2008 | Schottler et al. |
| 7,825,642 B1 * | 11/2010 | Young .................. H02M 3/156 323/224 |
| 8,589,016 B2 | 11/2013 | Bange et al. |
| 2006/0012344 A1 * | 1/2006 | Velhner .................. H02P 9/305 322/23 |

(Continued)

FOREIGN PATENT DOCUMENTS

DE 102007057502 A1 6/2009

OTHER PUBLICATIONS

Infineon Technologies, "Setting the P-1 Controller Parameters, KP and KI", Infineon Technologies, Application Note TLE7242 KI KP, Automotive Power, V2.0, Oct. 12, 2009, 13 pages.

*Primary Examiner* — Adolf D Berhane
(74) *Attorney, Agent, or Firm* — Slater Matsil, LLP

(57) ABSTRACT

A PWM signal generator to provide a supply current to an electrical load generates PWM signals at a first frequency, the PWM signals having a duty cycle. Operating the generator involves receiving a set point signal indicative of a target average value for the supply current, sensing a sensing signal indicative of a current actual value of the supply current, performing a closed-loop control of the supply current targeting the target value for the supply current via a controller such as a PID Controller which controls the duty cycle of the PWM signals generated by the PWM signal generator as a function of the offset of the sensing signal with respect to the set point signal.

9 Claims, 5 Drawing Sheets

(56) References Cited

U.S. PATENT DOCUMENTS

| | | |
|---|---|---|
| 2009/0015231 A1 | 1/2009 | Wu et al. |
| 2011/0204988 A1 | 8/2011 | Prodic et al. |
| 2014/0239854 A1* | 8/2014 | Suzuki ..................... H02P 5/68 |
| | | 318/35 |
| 2020/0228018 A1* | 7/2020 | Wiktor .................. H02M 3/156 |

* cited by examiner

METHOD OF OPERATING A CONTROLLER, CORRESPONDING CIRCUIT AND DEVICE

CROSS-REFERENCE TO RELATED APPLICATIONS

This application claims the benefit of Italian Application No. 102018000009991, filed on Oct. 31, 2018, which application is hereby incorporated herein by reference.

TECHNICAL FIELD

The description relates to controller circuits such as, for instance, PID (Proportional-Integral-Derivative) controllers.

One or more embodiments may be applied to controlling generators of signals to which Pulse-Width-Modulation, briefly PWM, is applied.

BACKGROUND

Generators of PWM-modulated signals (PWM signals) are widely used in various areas or technology, for instance for controlling currents flowing through electrical loads. Automotive applications such as braking and transmission are exemplary of such possible areas of application of PWM signal generators.

PWM signal generators may be used, for instance, for driving inductive loads such as solenoids with a resulting ripple in the current driven through the load. A closed-loop control circuit may be used to facilitate achieving an average load current corresponding to a desired set point. A Proportional-Integral-Derivative (briefly—PID) controller may be exemplary of such a control circuit.

Conventional arrangements may provide for the current ripple to be averaged out after measurement and before subtraction from the set point. Such averaging may result in a delay in the closed-loop control which may adversely affect performance during a transient response, for instance.

SUMMARY

Despite the extensive activity in that area, improved solutions overcoming such a limitation would be desirable.

An object of one or more embodiments is to contribute in providing such an improved solution.

According to one or more embodiments, that object can be achieved by means of a method having the features set forth in the claims that follow.

One or more embodiments may relate to a corresponding circuit.

One or more embodiments may relate to a corresponding device. A device including an inductive load such as a solenoid driven by means of a PWM signal generator may be exemplary of such a device.

The claims are an integral part of the technical teaching provided herein in respect of the embodiments.

One or more embodiments may provide a closed-loop controller circuit (e.g., a PID controller circuit) which may facilitate driving an electrical load an average target set point by controlling the duty cycle (that is the ratio of the "on" time to the sum of the "on" time and the "off" times) of a PWM signal.

One or more embodiments may be based on the recognition that permitting propagation of the PWM ripple through the control-loop, by refraining from averaging it out, may facilitate improved, faster transient response, with a higher stability and accuracy without ripple propagation being appreciably detrimental to control loop-operation.

One or more embodiments may facilitate achieving satisfactory operation via a judicious selection of the frequency at which the controller parameters are updated in relationship to the frequency of the PWM signal.

BRIEF DESCRIPTION OF THE DRAWINGS

One or more embodiments will now be described, by way of example only, with reference to the annexed figures wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
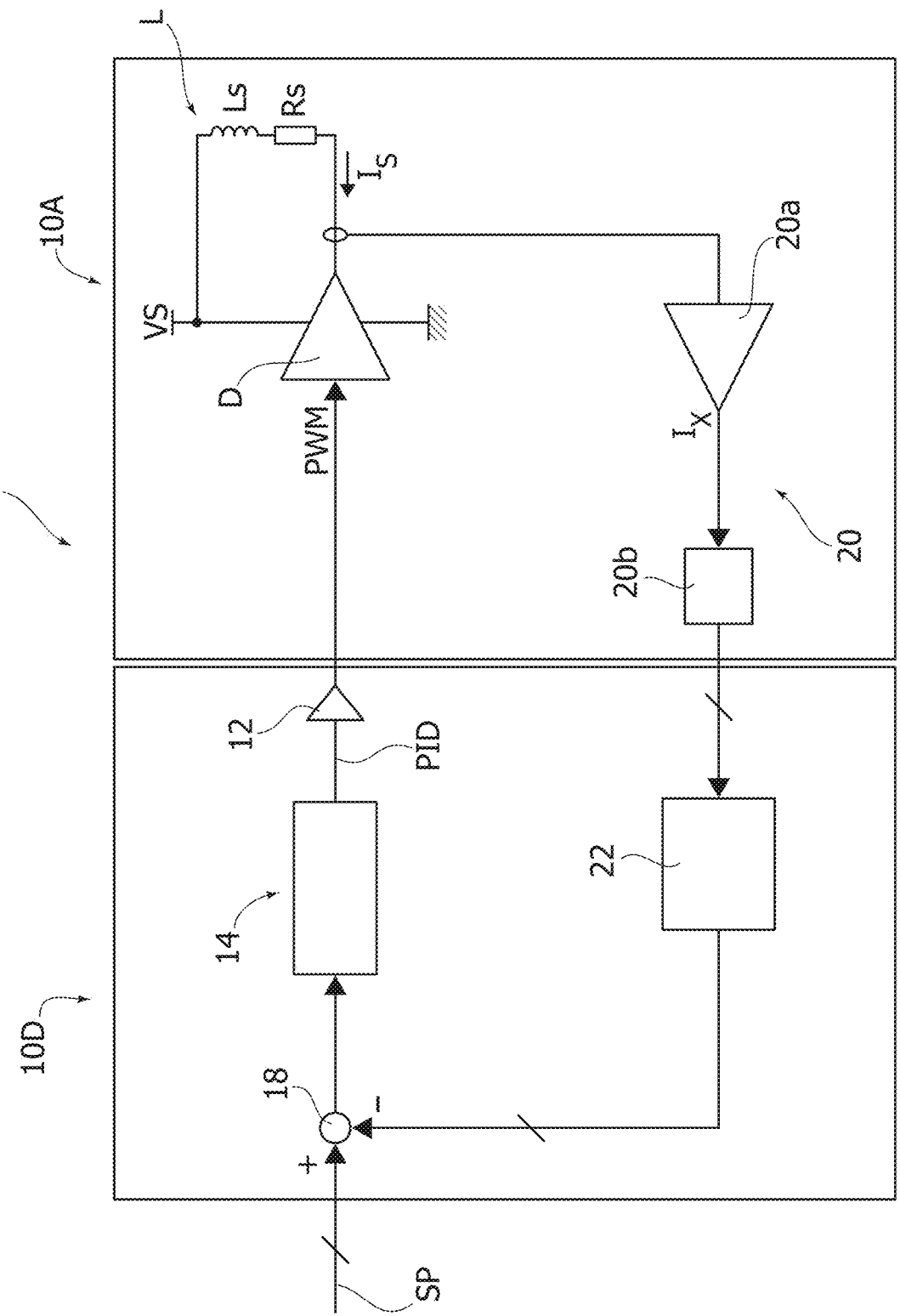
FIG. 1 is a block diagram of a feedback-loop control arrangement of a PWM signal generator.
Figure 2:
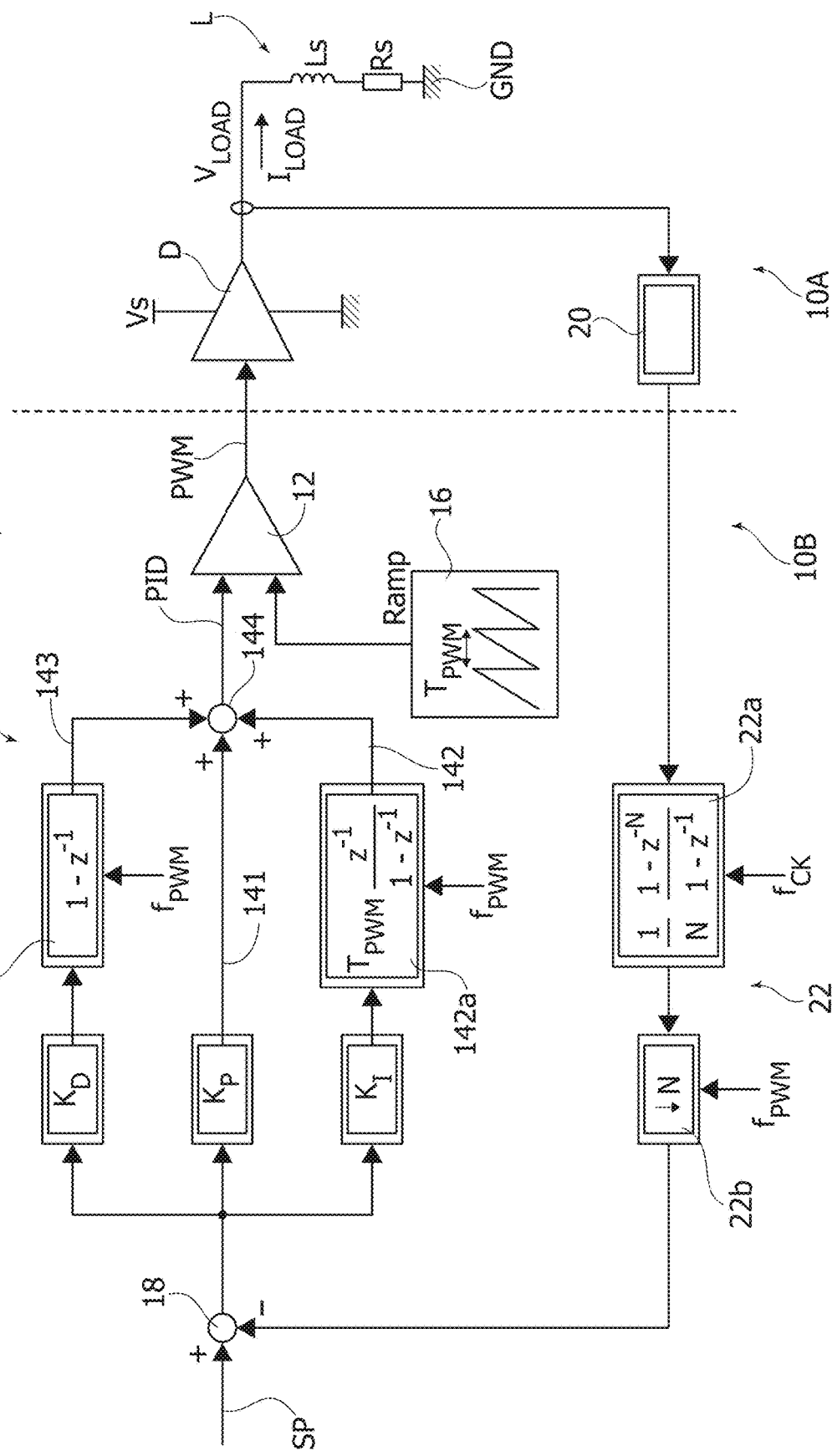
FIG. 2 is a circuit diagram of an exemplary implementation, with possible variations, of the arrangement of the FIG. 1.

In FIGS. 1 and 2, reference numeral 10 indicates as a whole a circuit arrangement which implements a closed-loop control strategy in a PWM driver arrangement of a load L, such as an inductive load.

A solenoid (for use, e.g. in a braking or transmission system in a vehicle, not visible in the figures as a whole) may be exemplary of such a load L, which may be represented as the series connection of an inductor Ls and a resistor Rs.

It will be otherwise appreciated that reference to a load L comprising a solenoid and/or to a possible application in the automotive field is merely for exemplary purposes and is not to be construed, even indirectly, in a limiting sense of the embodiments.

In an arrangement as exemplified herein, the load L is driven via a power driver circuit D receiving a supply voltage VS.

As exemplified in FIG. 1, the load L may be coupled between the supply voltage VS and the output of the power driver circuit D and be traversed by a current $I_S$.

As exemplified in FIG. 2, the load L may be coupled between the output of the power driver circuit D at a voltage $V_{LOAD}$ and ground GND and be traversed by a current $I_{LOAD}$.

In arrangements as exemplified in FIGS. 1 and 2, the driver stage D is in turn driven via a Pulse-Width Modulated signal PWM as generated by a PWM signal generator 12 associated with a controller circuit 14.

As exemplified in FIG. 2, the controller 14 may comprise a Proportional-Integral-Derivative (PID) controller in turn comprising, in a manner known to those of skill in the art:

a proportional branch 141 with an associated (proportional) gain $K_P$, an integral branch 142, with an associated (integral) gain $K_3$ and including an integrator circuit block 142A, and a derivative branch 143, with an associated (derivative) gain $K_D$ and including a derivative circuit block 143A.

The outputs from the branches 141, 142 and 143 are summed at a summation node 144 and applied as a control signal PID to one input of the PWM signal generator 12.

Again in a manner known to those of skill in the art the PWM signal generator 12 may essentially comprise a comparator circuit whose other input is supplied with a ramp signal Ramp by a ramp generator 16 which generates a triangular (saw-tooth) signal with a period $T_{PWM}$. The period of the ramp signal defines the period of the PWM signal generated by the generator 12 with a frequency $f_{PWM}$ ($f_{PWM=1}/T_{PWM}$).

Reference 18 indicates a summation node which receives at a first input (with a first sign, for instance positive) a set point signal SP indicative of a desired (average) value for the current through the load L.

Reference 20 denotes a sensing arrangement which may include a current sense amplifier (CSA) 20a coupled to the output from the driver D. The sensing arrangement 20 may thus be sensitive to the value of the current through the load L, that is, $I_S$ (FIG. 1) or $I_{LOAD}$ (FIG. 2).

As exemplified in FIG. 1, the sensing arrangement 20 may include a current sense amplifier 20a which senses—in any manner known to those of skill in the art—the current through the load L (for instance $I_S$, in the case of FIG. 1) and generates therefrom a scaled-down version $I_X$ of $I_S$ (for instance $I_X=I_S/256o$) which is supplied to an analog-to-digital converter (ADC) 20b.

An essentially similar arrangement can be adopted in the solution exemplified in FIG. 2 to generate Ix as a scaled-down version of $I_{LOAD}$.

In arrangements as exemplified in FIGS. 1 and 2, the sensing current $I_X$ (however generated), possibly converted to a digital format at 20b, can be supplied to an averaging circuit 22 to generate a corresponding average signal.

For instance, as exemplified in FIG. 2, the averaging circuit can comprise a (digital) integrator 22a operated at a frequency $f_{CK}$ and providing an average (integrated) value of N subsequent samples of the signal from the analog-to-digital converter 20b, such a value possibly down-sampled at a frequency $f_{PWM}$ corresponding to the frequency of the PWM signal from the generator 12 at a down-sampling circuit block 22b.

As exemplified in FIGS. 1 and 2, the average signal thus obtained is supplied to the summation node 18 where the feedback signal is combined (with an opposed sign, e.g. negative, and thus subtracted) from the set point signal SP with the combined (difference) from the node 18 input to the (e.g., PID) controller 14.

The signal PID from the controller 14 is applied to the (first) input of the comparator 12 to vary the duty cycle of the PWM signal from the PWM generator 12 so that the value of the duty cycle is controlled in a closed loop arrangement using the set point signal SP as a target so that the (average) value of the load current ($I_S$ or $I_{LOAD}$) can be set to a desired value as expressed by the signal SP (from a respective source such as a system microcontroller, not visible in the figures).

FIGS. 1 and 2 are thus exemplary of a closed-loop control arrangements 10 comprising:

an analogue portion 10A (right side of the figures) which facilitates generating a signal ($I_X$, for instance) indicative of the current $I_S$, $I_{LOAD}$ through the load L, a digital portion (left side of the figures) where such a signal indicative of the current in the load, converted to digital in 20b, is supplied to the averaging circuit 22 and then forwarded as a feedback signal towards the summation node 18 and the (e.g., PID) controller 14 with the associated PWM signal generator.

The feedback loop thus provided facilitates closed-loop control of the load current $I_S$, $I_{LOAD}$ with a target given by the set point value SP.

It will be otherwise appreciated that arrangements as exemplified in FIGS. 1 and 2 are substantially conventional in the art, which makes it unnecessary to provide a more detailed description herein.

In arrangements as exemplified in FIGS. 1 and 2 both the averaging stage 22 and the integral and derivative branches of the PID controller 14 (namely 142 and 143) are intended to be clocked (essentially, updated) at the same frequency of the PWM signal, $f_{PWM=1}/T_{PWM}$.

In arrangements as exemplified in FIGS. 1 and 2 the internal signals and the output signal PID from the controller 14 are updated (only) once at each cycle of the PWM signal of duration $T_{PWM}$.

Stated otherwise, in arrangements as exemplified in FIGS. 1 and 2, the internal, input and output signals of the controller 13 are practically constant within each interval corresponding to the period $T_{PWM}$ of the PWM signal.

It is noted that computation of the average value in the circuit block 22 (in the integrator 22a of FIG. 2, for instance) involves a delay or latency in the feedback control loop equal to one cycle $T_{PWM}$ of the PWM signal.

It is observed that such a delay or latency may penalize the response speed of the control-loop.

Correspondingly low values for the coefficients $K_P$, $K_1$ and $K_D$ are thus adopted in the controller 14 in order to facilitate frequency stability. For instance, it is observed that selecting for the coefficients $K_P$, $K_1$, $K_D$ values which facilitate keeping overshoot (undershoot) under 10% with respect to a typical specification value may result in a delay of 15 mS in the response to a (positive or negative) step in the set point SP before the controlled entity (that is the average value of the current through the load) returns within a range of e.g., 1% of the desired value.

Similarly one may observe that in an arrangement as exemplified in FIGS. 1 and 2 a positive/negative step from 10 V to 15 V (or from 15 V to 10 V) in the supply voltage VS may result in a transient current of +35% (−23%) over a time interval of 6 mS (10 mS).

Figure 3:
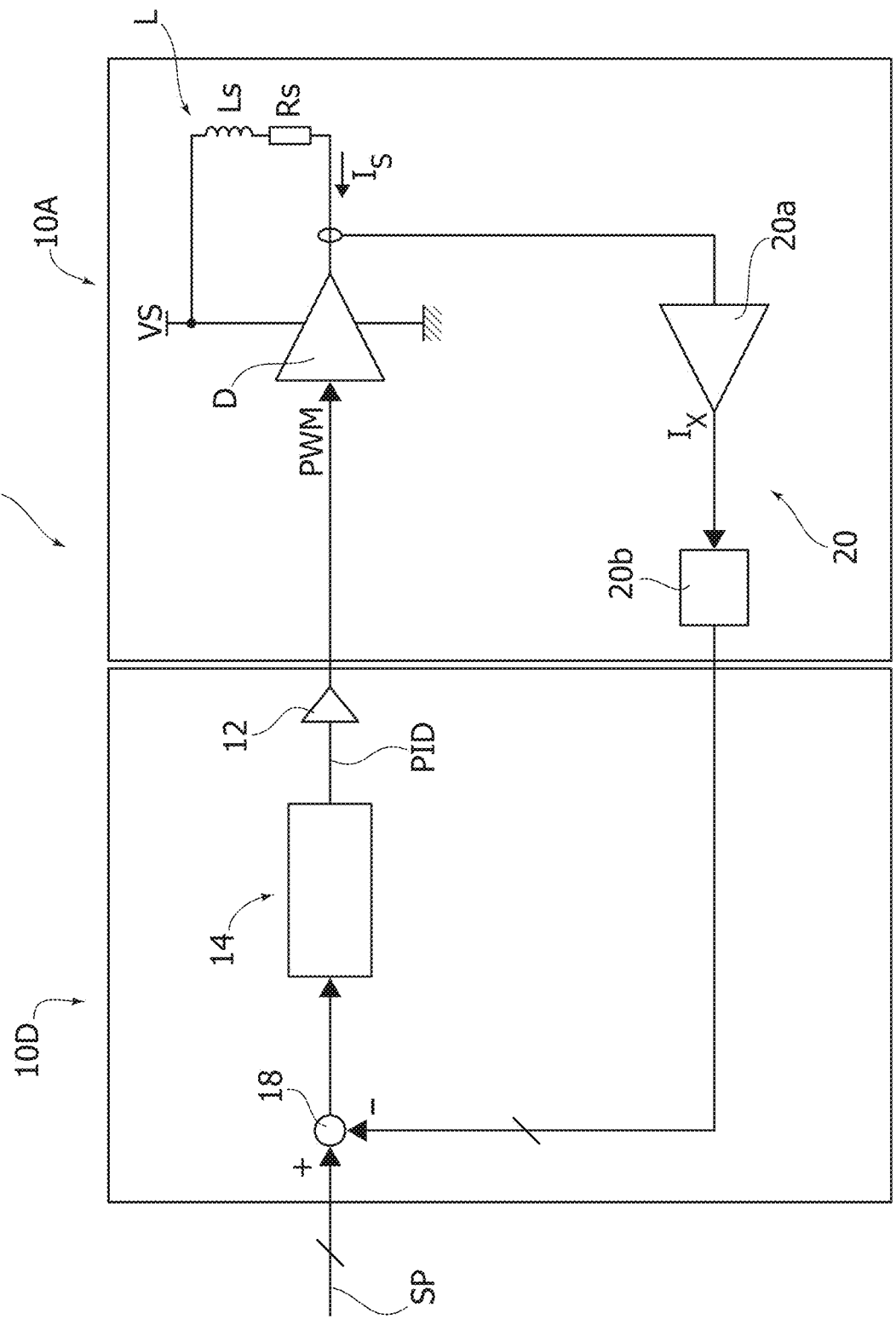
FIG. 3 is a block diagram of a feedback-loop control arrangement of a PWM signal generator as per the present disclosure.
Figure 4:
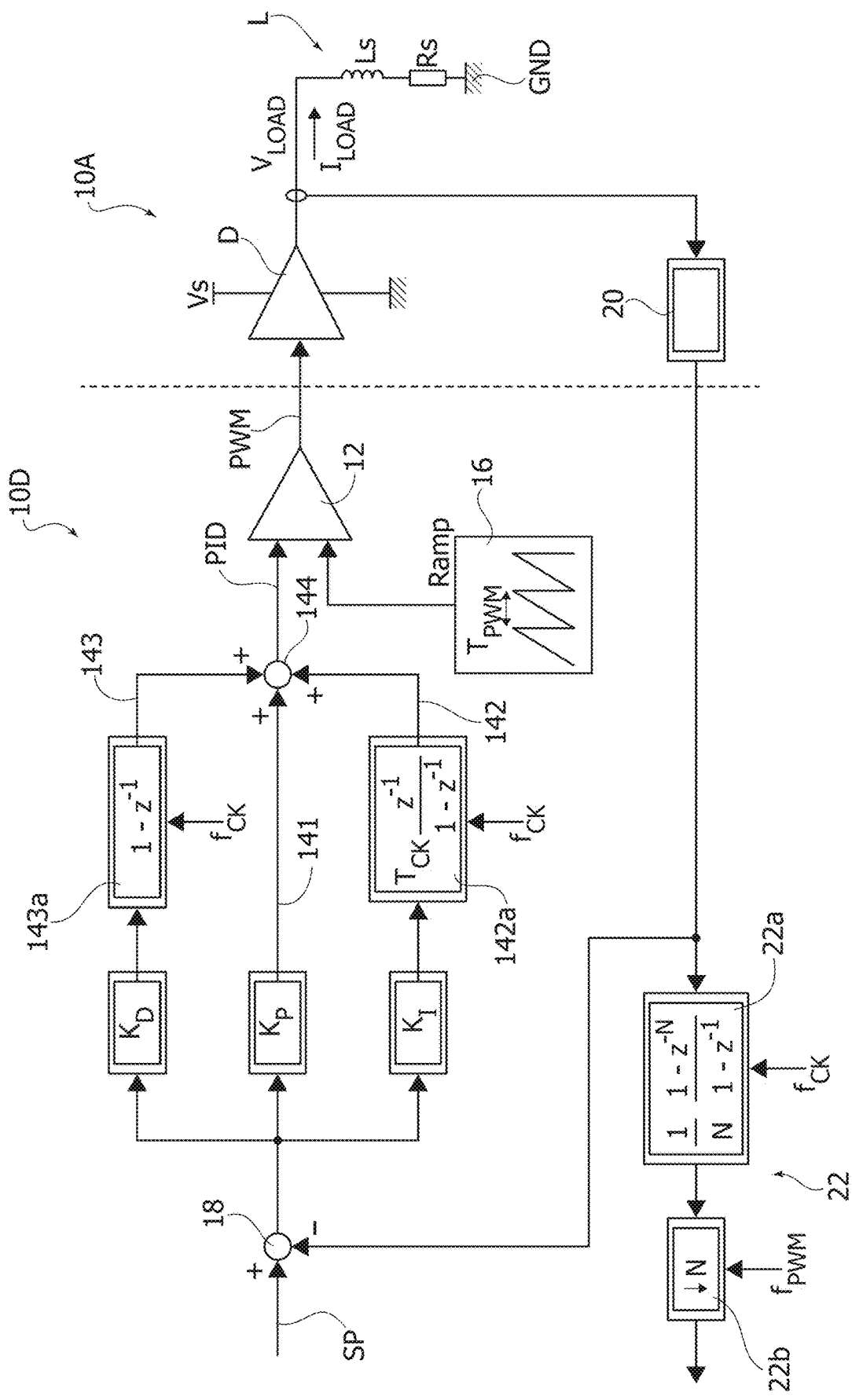
FIG. 4 is a circuit diagram of an exemplary implementation, with possible variations, of a possible implementation of the arrangement of the FIG. 3.

In one or more embodiments, those issues may be addressed by resorting to an arrangement as exemplified in FIGS. 3 and 4.

In FIGS. 3 and 4 parts or elements like parts or elements already discussed in connection with FIGS. 1 and 2 are indicated by like references, so that a corresponding detailed description will not be repeated here for brevity.

This applies, for instance (but not exclusively) to operation of the PWM signal generator 12 and control of the duty cycle of the PWM signal from the signal generator as a function of the signal PID from the controller 14.

Also, as exemplified in FIG. 3, the load L may be coupled between the supply voltage VS and the output of the power driver circuit D and be traversed by a current $I_S$; as exemplified in FIG. 4, the load L may be coupled between the output of the power driver circuit D at a voltage $V_{LOAD}$ and ground GND and be traversed by a current $I_{LOAD}$.

In one or more embodiments as exemplified in FIGS. 3 and 4 the averaging circuit 22 is "removed" from the control-loop so that the output signal from the sensing arrangement 20 (for instance the digital signal from the analog-to-digital converter 20b) is supplied to the (negative sign) input of the summation node 18 without being subjected to averaging.

For the sake of completeness, FIG. 4 exemplifies certain embodiments where, while "removed" from the feedback loop, the averaging circuit 22 (e.g., 22a, 22b) is retained arranged (outside) the control-loop to provide an averaged version of the signal from the sensing arrangement 20 (20a, 20b) as possibly desirable for other purposes (which per se may not be related to embodiments).

Still in connection with the representation of FIGS. 3 and 4, it will be appreciated that the load L (with the driver stage D associated therewith) may represent a distinct element from embodiments.

In brief, in an arrangement as exemplified in FIGS. 3 and 4, the internal signals as well as the output signal PID from the controller 14 may be updated "continuously", that is within each cycle of the PWM signal with a frequency $f_{CK}$ (1 MHz, for instance) which may be substantially higher than the frequency $f_{PWM}$ of the PWM signal (1 KHz, for instance).

The values indicated (which, of course, are in no way mandatory) are exemplary of a possible selection of a frequency $f_{CK}$ which is significantly higher than the frequency $f_{PWM}$. For instance, as exemplified herein, the frequency $f_{CK}$ can be selected at a value which is at least one order and optionally (about) three orders of magnitude higher than the frequency $f_{PWM}$ (that is $f_{CK}/f_{PWM}=10^3$).

This may be regarded as a sort of oversampling applied to the internal signals, the input signal and the output signal of the PID control arrangement so that these signals may vary (extensively) within each period $T_{PWM}$ of the PWM signal.

Removing the averaging arrangement 22 (22a, 22b) from the control loop (by possibly locating it outside the control loop as exemplified in FIG. 4) and consequently updating the signals in the PID control arrangement with a frequency (possibly much) higher than the frequency of the PWM signal dispenses with the delay or latency (equal to one cycle of the PWM signal) exhibited in arrangement as exemplified in FIGS. 1 and 2.

This facilitates selecting for the coefficients $K_P$, $K_1$ and $K_D$ fairly high values without detriment to frequency stability. This in turn facilitates a faster response to transients in the set point signal (SP) and improved rejection to undesired variations in the supply signal (VS).

For instance, in one or more embodiments as exemplified herein, selecting for the coefficients $K_P$, $K_1$, $K_D$ values which facilitate keeping overshoot (undershoot) under ±10% with respect to a typical specification value, may result in a delay of 4 mS in the response to a (positive or negative) step in the set point SP before the controlled entity (that is the average value of the current through the load) returns within a range of e.g., 1% of the desired value. This response to an input step is approximately three times faster than the corresponding performance observed in an arrangement as shown in FIGS. 1 and 2.

Similarly, one may observe that in one or more embodiments as exemplified in FIGS. 3 and 4 a positive/negative step from 10 V to 15 V (or from 15 V to 10 V) applied to the supply voltage VS may result in a transient current of +3% (−4%) over a time interval of 3 mS (2 mS).

Figure 5A:
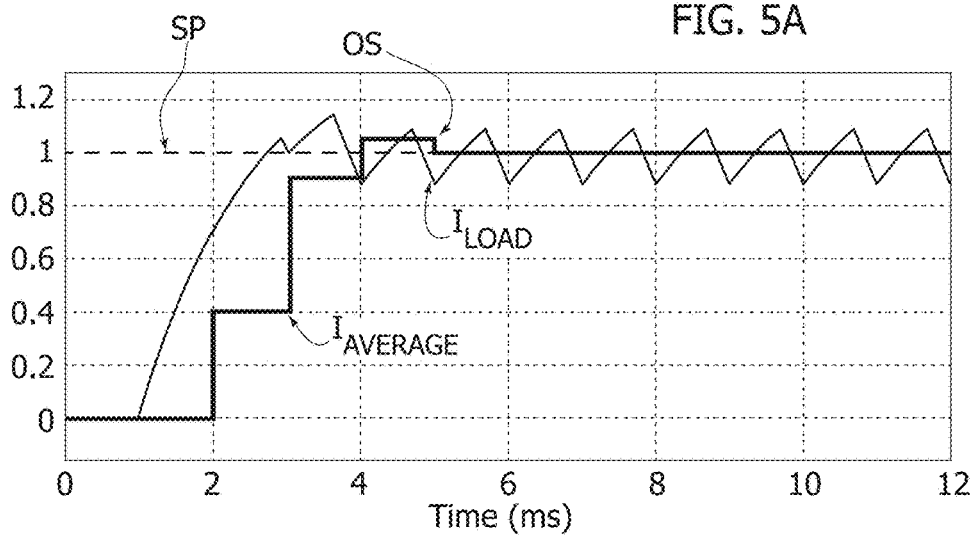
FIGS. 5A, 5B and 6 are time diagrams exemplary of possible operation of embodiments.
Figure 5B:
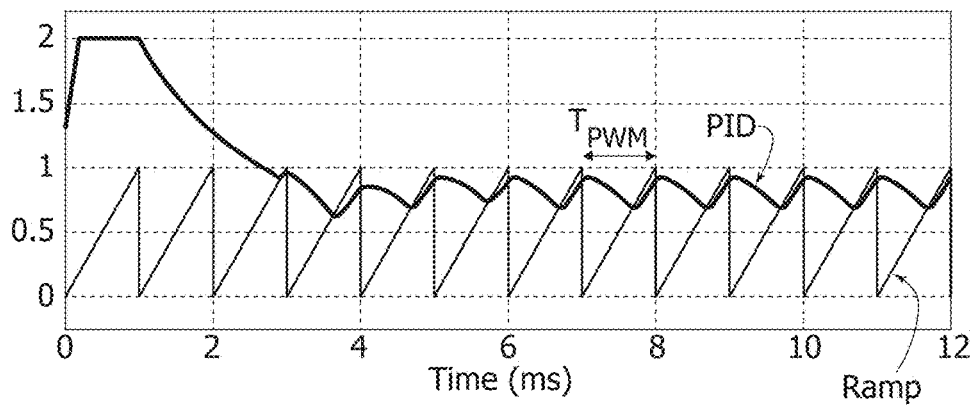
Figure 6:
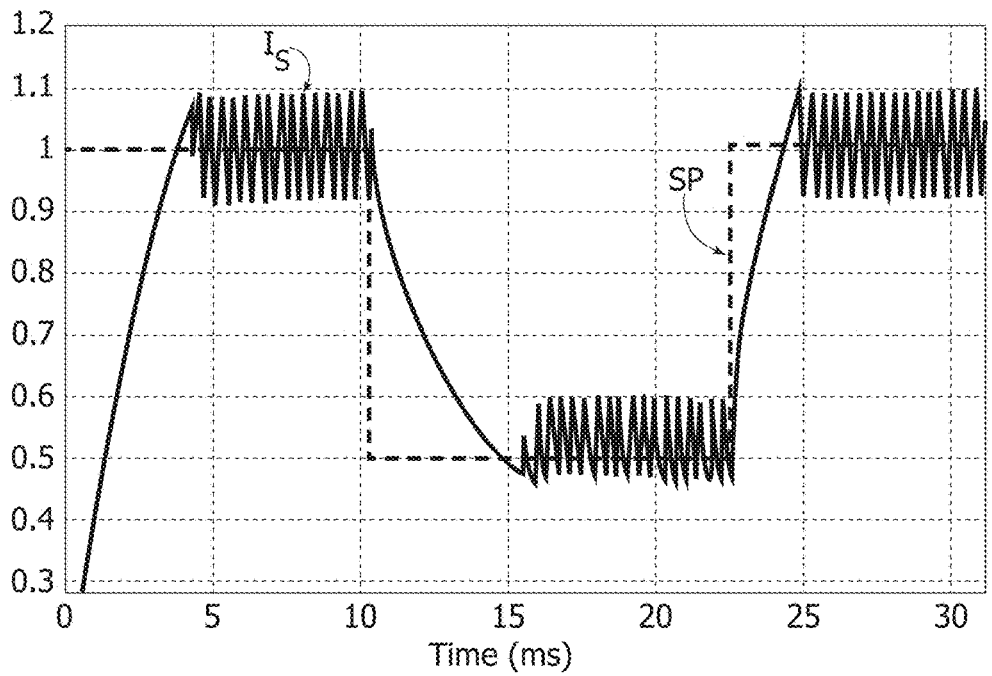

Possible performance of embodiments are exemplified herein is presented in FIGS. 5A, 5B and 6 which show over time abscissa scales in ms:

a possible time behavior of a load current $I_{LOAD}$ (FIG. 4) and its average value $I_{AVERAGE}$ (OS=overshoot) in the presence of a normalized upward step in the set point value SP (FIG. 5A);

a corresponding behavior of the PID current from the controller 14 and the ramp signal $R_{amp}$ to the PWM generator 12 (FIG. 5B);

a possible time behavior of a load current $I_S$ (FIG. 3) in the presence of a square wave variation between 0.5 and 1 in the set point value SP showing overshoot/undershoot confined within ±10% (FIG. 6).

One or more embodiments as exemplified in FIGS. 3 and 4 thus facilitate improving performance in respect of perturbations (on VS) with a sensitivity ten times lower over time durations three times shorter in comparison with conventional arrangements.

As exemplified herein, a method of controlling a PWM signal generator (e.g., 12) configured (see, e.g., the power driver D) to provide a supply current (e.g., $I_S$ in FIG. 3 or $I_{LOAD}$ in FIG. 4) to an electrical load (e.g., L), the PWM signal generator generating PWM (Pulse-Width-Modulation) signals at a first frequency (e.g., $f_{PWM}$), the PWM signals having a duty cycle (that is the ratio of the "on" time to the sum of the "on" time and the "off" time) may comprise:

receiving a set point signal (e.g., SP) indicative of a target (e.g., average) value for said supply current;

sensing (e.g., 20; 20a, 20b) a sensing signal (e.g., $I_X$) indicative of a current (actual) value for said supply current;

performing a closed-loop control of said supply current targeting (that is, having as a target) said target value for said supply current via a controller (e.g., 14, for instance a PID controller such as 141, 142, 143) controlling (e.g., via the signal indicated as PID) the duty cycle of the PWM signals generated by the PWM signal generator as a function of the offset (e.g., as calculated at the node 18) of the sensing signal with respect to the set point signal.

As exemplified herein, the sensing signal may be forwarded to said controller in the absence of averaging processing applied to said sensing signal. As shown in FIG. 4, such averaging processing may still be performed, yet out of the control loop.

As exemplified herein, a discrete-time version of the sensing signal may be produced (e.g., as a digitally converted version produced in the ADC 20b) and the duty cycle of the PWM signals generated by the PWM signal generator controlled as a function of the offset (e.g., as calculated at 18) of said discrete-time version of the sensing signal with respect to the set point signal.

As exemplified herein, the controller circuit may comprise at least one signal processing branch (e.g., the branches 142, 143) operating on discrete-time signals at a second frequency (e.g., $f_{CLK}$), wherein the method comprises selecting said second frequency as a multiple of said first frequency.

As exemplified herein, said second frequency may be selected at least one order of magnitude (that is, 10 times) and optionally about three orders of magnitude (that is, 103 times) higher than said first frequency.

As exemplified herein, the controller may comprise a PID controller including an integral branch (e.g., 142; $K_1$, 142a) and a derivative branch (e.g., 143; $K_D$, 143a) operating on discrete-time (e.g., digitally converted) signals.

As exemplified herein, the controller may be a digital controller and the method may comprise forwarding (e.g., via the node 18) to said controller said sensing signal in digital form (e.g., as converted at 20b).

As exemplified herein, a circuit may comprise:

a PWM signal generator configured to provide a supply current to an electrical load, the PWM signal generator generating PWM signals with a first frequency, the PWM signals having a duty cycle;

a controller configured to receive an offset signal indicative of the offset of a sensing signal indicative of a current (actual) value for said supply current with respect to a set point signal indicative of a target (e.g., average) value for said supply current;

the controller configured to perform a closed-loop control of said supply current targeting said target value for said supply current by controlling the duty cycle of the PWM signals generated by the PWM signal generator as a function of said offset signal with the method As exemplified herein.

As exemplified herein, a device may comprise:

a circuit as exemplified herein; and an electrical load (e.g., L) coupled to said PWM signal generator to receive said supply current.

Without prejudice to the underlying principles, the details and embodiments may vary, even significantly, with respect to what has been described by way of example only without departing from the extent of protection.

The extent of protection is determined by the annexed claims.

What is claimed is:

1. A method of controlling a PWM signal generator configured to provide a supply current to an electrical load, the PWM signal generator generating PWM signals at a first frequency, the PWM signals having a duty cycle, the method comprising:

receiving a set point signal indicative of a target value for said supply current;

sensing a sensing signal indicative of a current value for said supply current; and performing a closed-loop control of said supply current targeting said target value for said supply current via a controller controlling the duty cycle of the PWM signals generated by the PWM signal generator as a function of an offset of the sensing signal with respect to the set point signal.

2. The method of claim 1, comprising forwarding the sensing signal to said controller in the absence of averaging processing applied to said sensing signal.

3. The method of claim 1, comprising generating a discrete-time version of the sensing signal and controlling the duty cycle of the PWM signals generated by the PWM signal generator as a function of the offset of said discrete-time version of the sensing signal with respect to the set point signal.

4. The method of claim 1, wherein the controller comprises at least one signal processing branch operating on discrete-time signals at a second frequency, wherein the method comprises selecting said second frequency as a multiple of said first frequency.

5. The method of claim 4, comprising selecting said second frequency at least one order of magnitude and preferably about three orders of magnitude higher than said first frequency.

6. The method of claim 4, wherein the controller comprises a PID controller including an integral branch and a derivative branch operating on discrete-time signals.

7. The method of claim 1, wherein the controller is a digital controller and the method comprises forwarding to said controller said sensing signal in digital form.

8. A circuit, comprising:

a PWM signal generator configured to provide a supply current to an electrical load, the PWM signal generator generating PWM signals with a first frequency, the PWM signals having a duty cycle;

a controller configured to receive an offset signal indicative of the offset of a sensing signal indicative of a current value for said supply current with respect to a set point signal indicative of a target value for said supply current; and the controller configured to perform a closed-loop control of said supply current targeting said target value for said supply current by controlling the duty cycle of the PWM signals generated by the PWM signal generator as a function of said offset signal.

9. The circuit of claim 8, further comprising an electrical load coupled to said PWM signal generator to receive said supply current.

* * * * *